United States Patent [19]
Mullins, Jr.

[11] Patent Number: 5,883,567
[45] Date of Patent: Mar. 16, 1999

[54] PACKAGED INTEGRATED CIRCUIT WITH MAGNETIC FLUX CONCENTRATOR

[75] Inventor: Paul V. Mullins, Jr., Salem, N.H.

[73] Assignee: Analog Devices, Inc., Norwood, Mass.

[21] Appl. No.: 948,433

[22] Filed: Oct. 10, 1997

[51] Int. Cl.⁶ ................................................. H01C 43/00
[52] U.S. Cl. .......................................... 338/32 H; 428/611
[58] Field of Search ............................... 338/32 R, 32 H; 357/27, 55

[56] References Cited

U.S. PATENT DOCUMENTS

| | | | |
|---|---|---|---|
| 4,772,929 | 9/1988 | Manchester et al. | 357/27 |
| 4,970,463 | 11/1990 | Wolf et al. | 324/207.2 |
| 5,196,821 | 3/1993 | Partin et al. | 338/32 R |
| 5,198,795 | 3/1993 | Shibasaki et al. | 328/32 H |
| 5,569,544 | 10/1996 | Daughton et al. | 428/611 |
| 5,617,071 | 4/1997 | Daughton et al. | 338/32 R |

OTHER PUBLICATIONS

Hand Book of Chemistry and Physics (76th Edition) pp. 12–117 CRC Press Inc. 1995.
Nonvolatile Electronics, Inc., "Rapid Prototype Integrated GMR Sensors".
Nonvolatile Electronics, Inc., "GMR Magnetic Bridge Sensor".
Amko Electronics, Inc. Product Announcement," Amkor Dual–sided PowerSOP Packages".

Primary Examiner—Mark H. Paschall
Assistant Examiner—Jeffrey Pwu
Attorney, Agent, or Firm—Hale and Dorr LLP

[57] ABSTRACT

A flux concentrator made of a high permeability material is enclosed in a semiconductor package with a magnetic sensing integrated circuit to improve the uniformity and magnitude of the magnetic field sensed by the sensor.

13 Claims, 2 Drawing Sheets

PACKAGED INTEGRATED CIRCUIT WITH MAGNETIC FLUX CONCENTRATOR

FIELD OF THE INVENTION

The present invention relates to packaging integrated circuits, and particularly to packaging sensors for sensing magnetic fields.

BACKGROUND OF THE INVENTION

According to the well-known Hall effect, if a magnetic field is applied along a z-axis to a bar that carries a current along an x-axis, an electric field is produced along a y-axis. The electric field is proportional to the magnetic field and current density. The electric field can be sensed and used to determine the magnitude of the magnetic field or at least to determine when there is a significant change in the magnetic field.

A Hall cell is a sensor that utilizes the Hall effect. The Hall cell has a current-carrying bar and leads coupled across the bar for providing a signal that indicates the electric field. Such sensors can be integrated into an integrated circuit (IC) chip and packaged along with other circuitry.

A magnetic field between a magnet and a device made of a ferrous material can vary depending on a distance between the magnet and the device. Consequently, a sensor with one or more Hall cells can be used to sense distance or a change in distance when positioned between the magnet and the device. One known use for such a sensor is as a gear-tooth sensor for sensing a tooth or notch in a moving body; e.g., the body can be a cam shaft of an automobile, in which case the sensor can sense ignition timing. Such a sensor is shown, for example, in U.S. Pat. No. 4,970,463.

To improve sensing, a flux concentrator can be mounted between a sensor and a permanent magnet, as shown in the incorporated patent. However, a manufacturer of the sensor can only recommend that a customer do so if desired. In particular sensing systems, it may be difficult to provide such a flux concentrator in a useful position, and even with such a concentrator, there are gaps between the concentrator and sensing circuitry because of the width of the packaged sensor. Such gaps reduce the efficiency of the concentrator.

It is known that there is a leadframe with a paddle and leads made of alloy 42, a material with a permeability of 4,500 at B=20 gauss to a maximum of 70,000 Gausses/ Oersteds. Such a leadframe would be undesirable for use with a magnetic sensor, however, because the leads of the leadframe would tend to divert the magnetic field away from the sensing circuitry.

SUMMARY OF THE INVENTION

According to the present invention, a magnetic flux concentrator made of material with high permeability is incorporated into a packaged integrated circuit (IC) chip. With the concentrator, the magnetic field received by the IC is more uniform and concentrated than without. The IC includes a magnetic field sensor, such as one or more Hall cells. The concentrator is preferably made of permalloy or some other material with high permeability. For example, permalloy-78, after annealing, has a permeability of about 8000 at B=20 Gauss up to 100,000 Gauss/Oested.

The concentrator is preferably mounted under and against a leadframe paddle, and preferably extends near, up to the edge of, or slightly beyond the outside of the packaging. Alternatively, a leadframe paddle could itself be made of the high permeability and could be combined with a concentrator in a single integrated piece. In this case, the leads should not also be made of the material with high permeability but are preferably made with a material having very low permeability, such as copper with few impurities. For the leads and paddle to have a different material, the parts of the leadframe would have to be made separately, unlike the typical current process in which the frame and paddle are stamped at the same time from one piece of material.

With such a packaged concentrator, a uniform and isotropic concentrated field is provided to the sensing IC to increase its sensitivity and to provide a greater operating range than similar sensors without such a concentrator. The uniformity helps compensate for variations in flux from a source of magnetic field, such as a permanent magnet. By incorporating the flux concentrating material into the IC package rather than requiring that an end-user mount a separate piece of flux concentrating material between the chip and a magnet, assembly costs are reduced and the field near the sensing circuit is more concentrated. Other features and advantages will become apparent from the following detailed description, drawings, and claims.

DETAILED DESCRIPTION

Figure 1:
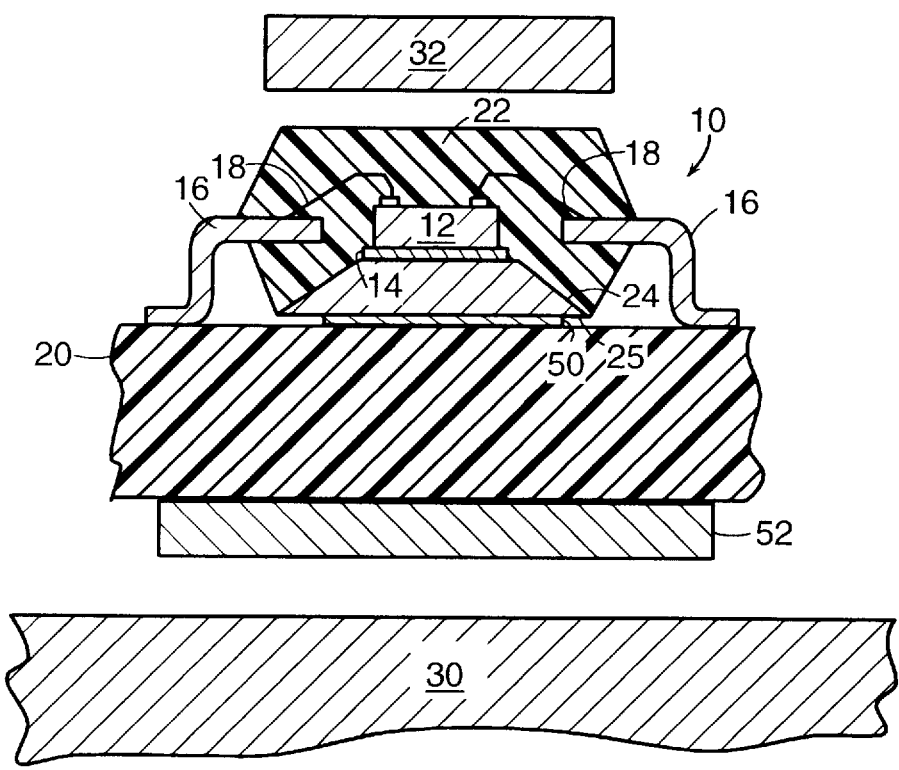
FIGS. 1–3 are, respectively, a cross-sectional view, a bottom view, and a side view of a packaged chip according to the present invention.
Figure 2:
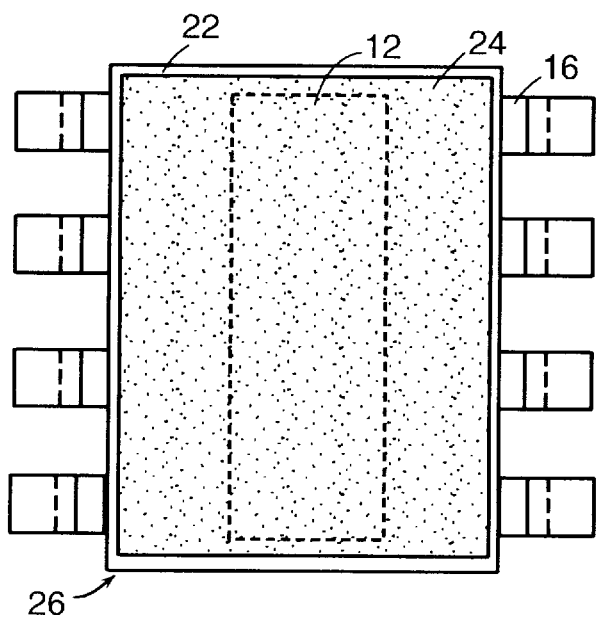
Figure 3:
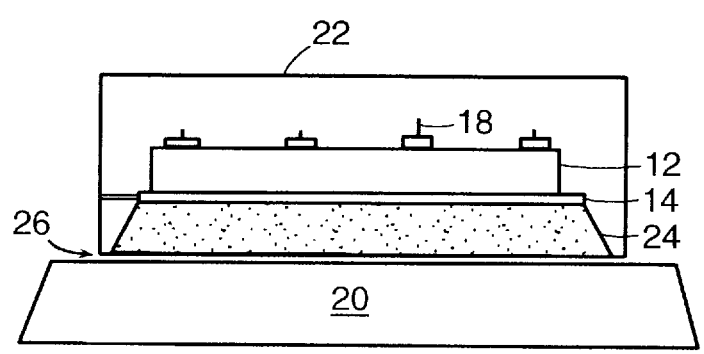

Referring to FIGS. 1–3, a packaged integrated circuit (IC) chip 10 has a die 12 mounted to a leadframe that includes a paddle 14 that supports the die, and leads 16 to which die 12 is connected with wire bonds 18. Leads 16 connect die 12 to a circuit board 20. Die 12 preferably includes a magnetic field sensor, such as one or more Hall cells.

A magnetic flux concentrator 24 is mounted to a bottom surface of paddle 14. Concentrator 24 is preferably made of permalloy-78, permalloy-80, or some other material with at least as high permeability as permalloy 78, i.e., at least 8000 at B=20 Gauss. Concentrator 24 extends downwardly from paddle 14 to a position near, down to, or slightly beyond a lower end 25 of packaged chip 10. It is desirable for concentrator 24 to cover as much of the bottom surface of the paddle and as much of the bottom surface of the chip as possible; consequently, concentrator 24 can be formed as a truncated rectangular pyramid to have a trapezoidal cross-section. For manufacturing purposes, however, it may be desirable to have a small border region 26 of plastic around concentrator 24 at the bottom of the chip as shown in FIGS. 2 and 3, and it may be desirable to provide the concentrator in some other shape, such as a rectangular block, a cylinder, or an ellipsoid. The concentrator can be provided either as a single solid piece, multiple pieces, or as a stack of laminated layers.

To extend a high permeability material up to the die, the paddle itself can be made of a flux conducting material with high permeability to further reduce gaps that can cause leakage in the magnetic field. In this case, the paddle can be attached to the concentrator, or the concentrator can be an integral piece that also serves as the paddle itself. The concentrator thus preferably extends at least close to the die in that it is either near the die or abuts the die. In the case of the flux conducting paddle, the leads of the leadframe should be made of a material with a much lower permeability than that of the paddle, i.e., an alloy with substantially no ferrous material. Typical leadframes are currently made of alloys primarily with copper, which has substantially zero permeability in a pure state. To reduce the permeability, the amount of copper is increased and ferrous components and impurities decreased. Currently, leadframes are stamped from one piece of material; a combination paddle/concentrator would therefore require that the leadframe be made from separate pieces.

After die 12 is bonded to paddle 14, it is preferably enclosed in a plastic packaging material 22, such as thermal set epoxy, which is typically flowed as a liquid and hardens around die 12 in a generally known manner. The result is a packaged chip, such as an 8-pin SOIC (as shown), although the present invention can be used with other types of packages.

Referring particularly to FIG. 1, when a magnet 30 is placed below circuit board 20, concentrator 24 causes the magnetic field between magnet 30 and die 12 to be highly uniform, isotropic, and concentrated. The resulting concentrated magnetic field, which is also a function of the distance to a device 32, is sensed by the sensing chip.

In one experiment, it was found that a signal response from a chip (the response was a measure of the E-field perpendicular to the B-field) increased by about 50% when a plastic package was modified such that part of the plastic packaging was removed and replaced with a 0.01 inch thick piece of permalloy. In another experiment, in addition to removing part of the plastic packaging and replacing it with a strip of permalloy, a strip was also placed between the circuit board and packaged die. The signal increased by a total of about 70% in the latter case.

Concentrator 24 also makes the magnetic flux more uniform, thus improving inconsistencies in magnets and improving the overall response. For a typical fixed magnet, there is some point of maximum flux at the surface of the magnet. This point is difficult to control, however, and can vary from one permanent magnet to another due to impurities in the magnets. The improvement in uniformity is especially important when a small magnet is used with a chip that has sensing cells on opposite sides of a chip, and particularly when a fine level of precision is required.

The present invention also includes a method for making a sensor chip and sensing assembly. A sensing circuit is mounted to a top side of a paddle and is connected to leads with wire bonds. A flux concentrator is mounted to a bottom side of the paddle, and the die is connected to leads of a leadframe with wire bonds. The circuit, paddle, leads, and wire bonds are packaged, preferably by placing them in a mold, and flowing a plastic encapsulating material around them to enclose the circuit, to at least partially enclose the concentrator, and to enclose part of the leads so that the rest of the leads extend away from the packaging. If the paddle were made of a flux concentrating material, the two mounting steps would be replaced by one step of mounting the circuit to the flux concentrator.

Additionally, referring again to FIG. 1, to further reduce gaps in the system, other pieces 50, 52 of flux concentrating material can be positioned between the magnet and the circuit board, or between the circuit board and the chip.

Having described embodiments of the present, it should be apparent that other modifications can be made without departing from the scope of the appended claims. While the concentrator has been described for use with Hall cells and position sensing, it can be used with any packaged magnetic field sensor, whether used for gear tooth sensing or for other purposes.

What is claimed is:

1. An apparatus comprising:

a paddle;

an integrated circuit die mounted on the paddle;

a flux concentrator made of a material with permeability of at least about 8000 Gauss/oersted at a flux density B=20 Gauss and positioned at least close to the paddle; and a semiconductor package enclosing the integrated circuit die and the paddle and at least partially enclosing the flux concentrator together in a single packaged device.

2. The apparatus of claim 1, the package including a plastic material enclosing the die and at least partially surrounding the flux concentrator.

3. The apparatus of claim 1, further including leads and wire bonds electrically coupling the leads and the die, the leads having a permeability of about zero.

4. The apparatus of claim 1, wherein the concentrator has a first and second opposite sides, a first side with a smaller area facing the integrated circuit, and a second side with a larger area facing away from the integrated circuit.

5. The apparatus of claim 4, wherein the concentrator has a trapezoidal cross-section.

6. The apparatus of claim 1, wherein the concentrator is cylindrical.

7. The apparatus of claim 1, wherein the concentrator is ellipsoidal.

8. A sensing assembly comprising:

a magnetic field source;

a circuit board positioned near the magnetic field source; and a packaged chip including:

leads extending away from the chip and electrically coupled to the circuit board, an integrated die including a sensor for sensing a magnetic field, wire bonds electrically coupling the integrated die and the leads, a flux concentrator made of a high permeability material and disposed at least close to the integrated sensor die, wherein the high permeability material has a permeability of at least 8000 Gauss/oersted at a flux density B=20 Gauss, and a package material enclosing the integrated sensor die and at least partially enclosing the flux concentrator.

9. The assembly of claim 8, wherein the source of a magnetic field includes a permanent magnet.

10. The assembly of claim 8, further including a leadframe paddle, the sensor die mounted to one side of the paddle and the flux concentrator mounted to another side of the paddle.

11. The assembly of claim 10, wherein the paddle has a relatively high permeability and the leads have substantially zero permeability.

12. The assembly of claim 8, further comprising a magnetic flux concentrator between the packaged chip and the circuit board.

13. The assembly of claim 8, wherein the flux concentrator abuts and supports the die and thereby serves as a paddle.

* * * * *